United States Patent
Imanishi et al.

[19]
[11] Patent Number: 5,886,291
[45] Date of Patent: Mar. 23, 1999

[54] THERMOELECTRIC CONVERSION MODULE AND METHOD OF MANUFACTURING THE SAME

[75] Inventors: Yuichiro Imanishi; Makoto Miyoshi; Tetsuo Watanabe, all of Nagoya; Keiko Kushibiki, Fujisawa; Kazuhiko Shinohara, Yokohama; Masakazu Kobayashi, Yokosuka; Kenji Furuya, Yokohama, all of Japan

[73] Assignee: NGK Insulators, Ltd., Japan

[21] Appl. No.: 744,990

[22] Filed: Nov. 7, 1996

[30] Foreign Application Priority Data

Nov. 3, 1995 [JP] Japan .................................... 7-294348

[51] Int. Cl.$^6$ .................................................. H01L 35/28
[52] U.S. Cl. ............................................................ 136/203
[58] Field of Search ..................................... 136/201, 203, 136/205, 224, 225, 227, 242, 211, 212

[56] References Cited

U.S. PATENT DOCUMENTS

| | | | |
|---|---|---|---|
| 2,980,746 | 4/1961 | Claydon ........................................ | 136/4 |
| 3,248,777 | 5/1966 | Stoll ........................................ | 29/155.5 |
| 3,252,205 | 5/1966 | Hancock et al. ........................ | 29/155.5 |
| 3,264,714 | 8/1966 | Baer, Jr. .................................. | 29/155.5 |
| 3,284,877 | 11/1966 | Naake .................................... | 29/155.5 |
| 3,509,620 | 5/1970 | Phillips .................................... | 29/573 |
| 3,615,870 | 10/1971 | Crouthamel ............................ | 136/204 |
| 4,149,025 | 4/1979 | Niculescu .............................. | 136/206 |
| 4,493,939 | 1/1985 | Blaske et al. .......................... | 136/212 |
| 5,362,983 | 11/1994 | Yamamura et al. ................... | 257/414 |

FOREIGN PATENT DOCUMENTS

| | | | |
|---|---|---|---|
| 718574 | 9/1965 | Canada .................................. | 136/201 |
| 57-7215 | 1/1982 | Japan . | |
| 59-177114 | 10/1984 | Japan . | |
| 60-71019 | 4/1985 | Japan . | |
| 62-144726 | 6/1987 | Japan . | |
| 5-315656 | 11/1993 | Japan . | |
| 6-9260 | 2/1994 | Japan . | |
| 1130334 | 10/1968 | United Kingdom . | |
| 2 160 358 | 12/1985 | United Kingdom . | |

*Primary Examiner*—Kathryn Gorgos
*Assistant Examiner*—Thomas H. Parsons
*Attorney, Agent, or Firm*—Parkhurst & Wendel

[57] ABSTRACT

A thermoelectric conversion module having a large capacity and a curved surface is manufactured by immersing a honeycomb structural body having a number of through holes, openings of every other through holes being closed by clogging members, into a semiconductor material melt of one conductivity type to suck the semiconductor material melt into through holes whose openings are not closed, cooling the thus sucked semiconductor material melt to form semiconductor elements of one conductivity type, immersing again the honeycomb structural body after removing the clogging members into a semiconductor material melt of the other conductivity type to suck the semiconductor material melt into the through holes, cooling the thus sucked semiconductor material melt to form semiconductor elements of the other conductivity type, cutting the honeycomb structural body into a plurality of thermoelectric conversion module main bodies, and providing metal electrodes of both surfaces of a thermoelectric conversion module main body such that alternate semiconductor elements of one and the other conductivity types are connected in series.

8 Claims, 8 Drawing Sheets

THERMOELECTRIC CONVERSION MODULE AND METHOD OF MANUFACTURING THE SAME

BACKGROUND OF THE INVENTION

1. Field of the Invention

The present invention relates to a thermoelectric conversion module for use in an apparatus utilizing a thermoelectric effect such as an electronic cooling apparatus and an electric power generating apparatus, and more particularly to a thermoelectric conversion module having N type semiconductor elements and P type semiconductor elements connected in series by means of metal electrodes. The present invention also relates to a method of manufacturing such a thermoelectric conversion module.

2. Related Art Statement

There have been proposed various kinds of thermoelectric conversion modules utilizing the Seebeck effect, Peltier effect and Thomson effect. Among these thermoelectric conversion modules, there have been realized a Seebeck effect element and Peltier effect element, in which a thermoelectric element is formed by joining different kinds of metals. In the Seebeck effect element, different kinds of metals are joined to constitute a closed loop, and thermo-electricity is generated by making junctions at different temperatures. Such a Seebeck effect element may be utilized a thermoelectric element. In the Peltier effect element, different kinds of metals are joined to form a closed loop and an electric current is passed through the loop in a given direction to cause heat absorption at one junction point and heat generation at the other junction point. Such a thermoelectric element may be utilized as a thermoelectric heating element or thermoelectric cooling element. In order to improve the efficiency of these elements, a junction between a semiconductor and a metal has been widely used.

Figure 1:
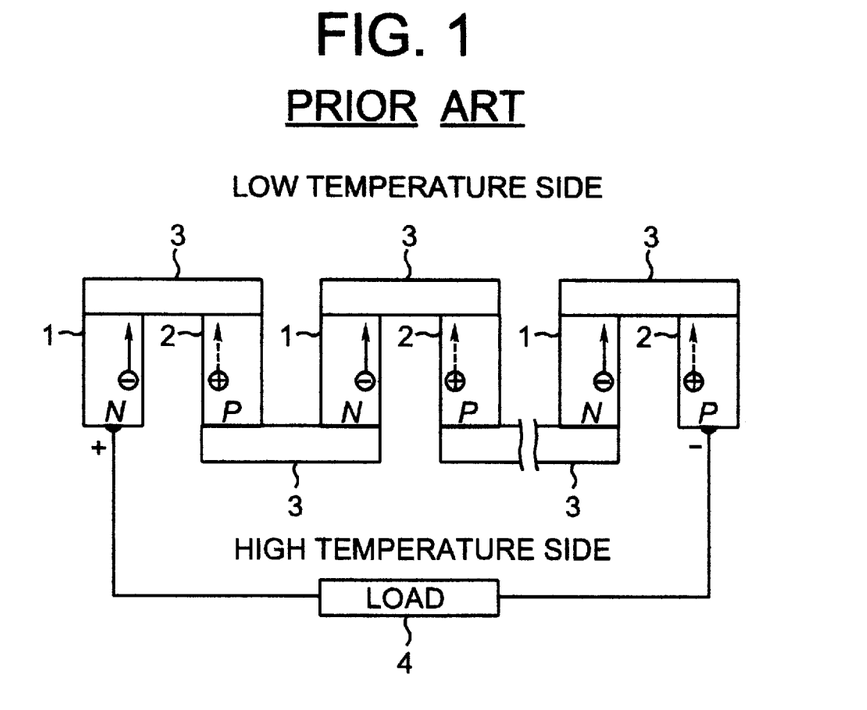
FIG. 1 is a schematic view showing a known thermoelectric conversion module.

FIG. 1 is a schematic view showing a principal structure of a known thermoelectric conversion module constructed as the above mentioned thermoelectric element. The thermoelectric conversion module comprises a number of N type semiconductor elements 1 and a number of P type semiconductor elements 2, said N and P type semiconductor elements being arranged alternately. Adjacent N type and P type semiconductor elements 1 and 2 are connected in series by means of electrodes 3 made by metal segments. The left side N type semiconductor element 1 and the right side P type semiconductor element 2 of the series connection semiconductor element array are connected to opposite ends of a load 4. One side of the semiconductor array is placed in a higher temperature environment and the other side is placed in a lower temperature environment. Then, in each of the N type semiconductor elements 1, electrons flow from the high temperature side to the low temperature side as shown by solid lines. In each of the P type semiconductor elements 2, holes flow from the high temperature side to the low temperature side as depicted by broken lines. Therefore, a voltage is applied across the load 4 with a polarity depicted in FIG. 1. The semiconductor elements 1 and 2 may be made of Bi—Te semiconductor (for instance $Bi_2Te_3$), Bi—Sb semiconductor (for example $Bi_{0.88}Sb_{0.12}$) or Si—Ge (for instance $Si_{0.8}Ge_{0.2}$).

Figure 2:
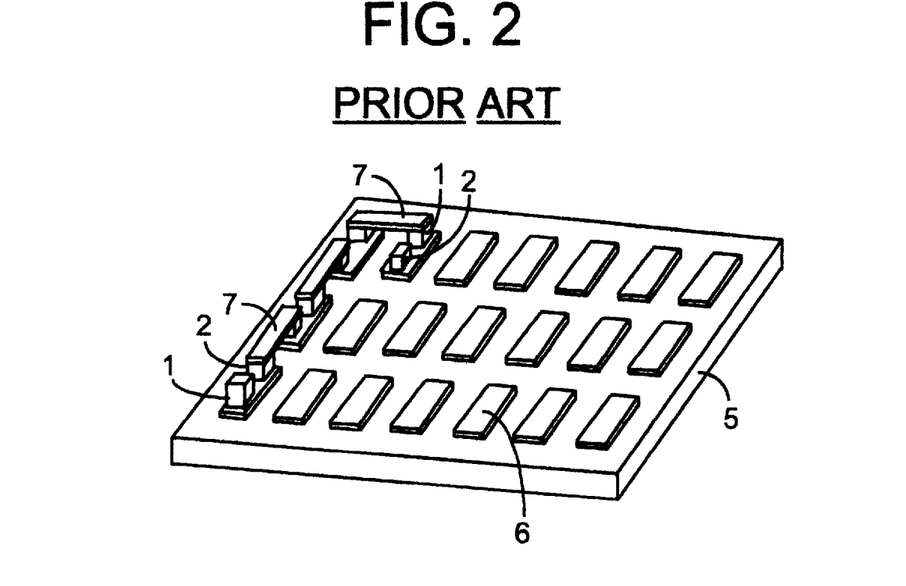
FIG. 2 is a perspective view illustrating a known method of manufacturing the thermoelectric conversion module.

FIG. 2 is a perspective view showing a known method of manufacturing the above mentioned known thermoelectric conversion module. On a surface of an insulating substrate 5 are secured electrode metal strips 6 by brazing in accordance with a given pattern. Then, N type semiconductor elements 1 and P type semiconductor elements 2 are secured to the metal segments 6 by brazing or soldering. The semiconductor elements 1 and 2 may be formed by a single crystal melting method or a sintered semiconductor material cutting method. On upper surfaces of the N type and P type semiconductor elements 1 and 2 there are secured metal segments 7 by means of brazing or soldering. In this manner, the N type semiconductor elements 1 and P type semiconductor elements 2 are arranged alternately and are connected in series by means of the metal segments 6 and 7. In this case, it has been proposed to secure the metal segments 7 simultaneously to the semiconductor elements 1 and 2 by using an insulating plate on which a metal electrode pattern is previously formed.

In Japanese Patent Publication No. 6-9260 (JP 6-9260), there is disclosed a known method of manufacturing a thermoelectric conversion module, in which a molten or fused semiconductor material is sucked into a thin quartz or glass tube having a size of 7Φ×5Φ×600 mm by means of a sucking tool, and after cooling the semiconductor material melt, the tube is cut into pieces having a given length. Then, these tubes are arranged side by side.

In Japanese Patent Laid-open Publication Kokai Hei 5-315656 (JP 5-315656), there is proposed another known method of manufacturing a thermoelectric conversion module, in which a molten thermoelectric material is poured into holes formed in an electrically insulating substrate made of a heat resistant material. In this method, the mechanical strength of the module is reinforced by the substrate, while a superior property of one direction solidified material is maintained.

If a large capacity thermoelectric conversion module including a large number of thermoelectric elements is to be manufactured by the first mentioned known method, extremely high working precision and high assembling faculty are required, and thus a manufacturing cost will be increased very much. Moreover, it is impossible to manufacture a thermoelectric conversion module having a curved surface. Such a curved surface is required when a thermoelectric conversion module is secured to a base member having a curved surface. In this manner, the module made by this known method could not be used in various applications. For instance, when the thermoelectric conversion module is applied to a system in which electric power is generated by using waste heat of an internal combustion engine, a space for providing the thermoelectric conversion module is limited and in many cases it is desired to provide the thermoelectric conversion module on a curved surface. However, the module made by the above mentioned known method could not have a curved surface, and therefore could not be applied to such a thermoelectric power system.

In the known method described in JP 6-9260, the sucking tool has various problems in reliability, durability and cost. Moreover, this known method requires a rather complicated process. Also in this method it is impossible or at least very difficult to manufacture a thermoelectric conversion module having a curved surface.

In the known method disclosed in JP 5-315656, a molten thermoelectric material could be uniformly introduced into holes formed in the insulating substrate only with difficulty. This method is not also suitable for obtaining a thermoelectric conversion module having a curved surface.

SUMMARY OF THE INVENTION

The present invention has for its object to provide a useful and novel thermoelectric conversion module having a curved surface.

It is another object of the invention to provide a thermoelectric conversion module having a large capacity.

It is another object of the invention to provide a method of manufacturing a thermoelectric conversion module having a large capacity and a curved surface in an accurate, simple and cheap manner.

According to the invention, a thermoelectric conversion module comprises:

- a structural body made of an electrically insulating material and having a first surface, a second surface opposing to said first surface, and a plurality of channels which extend from said first surface to said second surface;
- a plurality of N type semiconductor elements which are formed by sucking an N type semiconductor material melt into selected ones of said channels of said structural body;
- a plurality of P type semiconductor elements which are formed by sucking an P type semiconductor material melt into selected ones of said channels of said structural body; and
- metal electrodes provided on said first and second surfaces of the structural body such that adjacent one or more N type semiconductor elements and one or more P type semiconductor elements are connected in series by means of said metal electrodes.

In a preferable embodiment of the thermoelectric conversion module according to the invention, wherein said channel is formed to satisfy the following condition:

$$S/a \leq \gamma \cdot \cos \theta / h \cdot \rho \cdot g$$

wherein S is a cross sectional area of the channel, a is a circumferential length of the channel, $\gamma$ a surface tension, $\theta$ is a contact angle between the semiconductor material melt and a partition which constitutes said channel, h a height of the molten semiconductor material which rises up within the channel by the capillary phenomenon, $\rho$ a density of the semiconductor material melt, and g is the acceleration of gravity.

According to the invention, a method of manufacturing a thermoelectric conversion module comprises the steps of:

- preparing a structural body made of an electrically insulating material and having a first surface, a second surface opposing to said first surface, and a plurality of channels which extend from said first surface to said second surface;
- closing openings of every other channel or channel group in said first surface of the structural body by means of clogging members;
- immersing said structural body into a semiconductor material melt of one conductivity type to suck the semiconductor material melt of one conductivity type into channels whose openings are not closed, while said first surface of the structural body is faced downward;
- cooling the semiconductor material melt of one conductivity type sucked into the channels to form semiconductor elements of one conductivity type within said channels;
- closing openings of every other channel or channel group in said second surface of the structural body by means of clogging members, said channels having said semiconductor elements formed therein;
- immersing said structural body into a semiconductor material melt of the other conductivity type to suck the semiconductor material melt of the other conductivity type into channels whose openings are not closed, while said second surface of the structural body is faced downward;
- cooling the semiconductor material melt of the other conductivity type sucked into the channels to form semiconductor elements of the other conductivity type within said channels;
- cutting said structural body having the semiconductor elements of one conductivity type and the other conductivity type formed within every other channels or every other channel groups into a desired shape to form a thermoelectric conversion module main body; and
- forming metal electrodes on opposite surfaces of said thermoelectric conversion module main body such that adjacent one or more semiconductor elements of one conductivity type and one or more semiconductor elements of the other conductivity type are connected in series by means of said metal electrodes.

According to another aspect of the invention, a method of manufacturing a thermoelectric conversion module comprises the steps of:

- preparing a honeycomb structural body made of an electrically insulating material and having a first surface, a second surface opposing to said first surface, a plurality of channels which extend substantially from said first surface to said second surface, a number of first clogging members which close openings of alternate one or more channels in said first surface, and a number of second clogging members which close openings of channels in said second surface, said channels being not closed by said first clogging members and said first and second clogging members being made of a material which passes an air but does not pass a liquid;
- immersing said honeycomb structural body into a semiconductor material melt of one conductivity type to suck the semiconductor material melt of one conductivity type into channels whose openings are not closed by said first clogging members, while said first surface of the is structural body is faced downward;
- cooling the semiconductor material melt of one conductivity type sucked into the channels to form semiconductor elements of one conductivity type within said channels;
- immersing said honeycomb structural body into a semiconductor material melt of the other conductivity type to suck the semiconductor material melt of the other conductivity type into channels whose openings are not closed by said second clogging members, while said second surface of the structural body is faced downward;
- cooling the semiconductor material melt of the other conductivity type sucked into the channels to form semiconductor elements of the other conductivity type within said channels;
- cutting said honeycomb structural body having the semiconductor elements of one conductivity type and the other conductivity type formed within every other channel or every other channel group into a desired shape to form a thermoelectric conversion module main body; and
- forming metal electrodes on opposite surfaces of said thermoelectric conversion module main body such that adjacent one or more semiconductor elements of one conductivity type and one or more semiconductor elements of the other conductivity type are connected in series by means of said metal electrodes.

In a preferable embodiment of the method according to the invention, said step of sucking the semiconductor material melt into the channels is performed to satisfy the following condition:

$$S/a \leq \gamma \cdot \cos \theta / h \cdot \rho \cdot g$$

wherein S is a cross sectional area of the channel, a is a circumferential length of the channel, $\gamma$ a surface tension, $\theta$ a contact angle between the semiconductor material melt and a partition which constitutes said channel, h a height of the molten semiconductor material which rises up within the channel by the capillary phenomenon, $\rho$ a density of the semiconductor material melt, and g is the acceleration of gravity.

DESCRIPTION OF THE PREFERRED EMBODIMENTS

Figure 3:
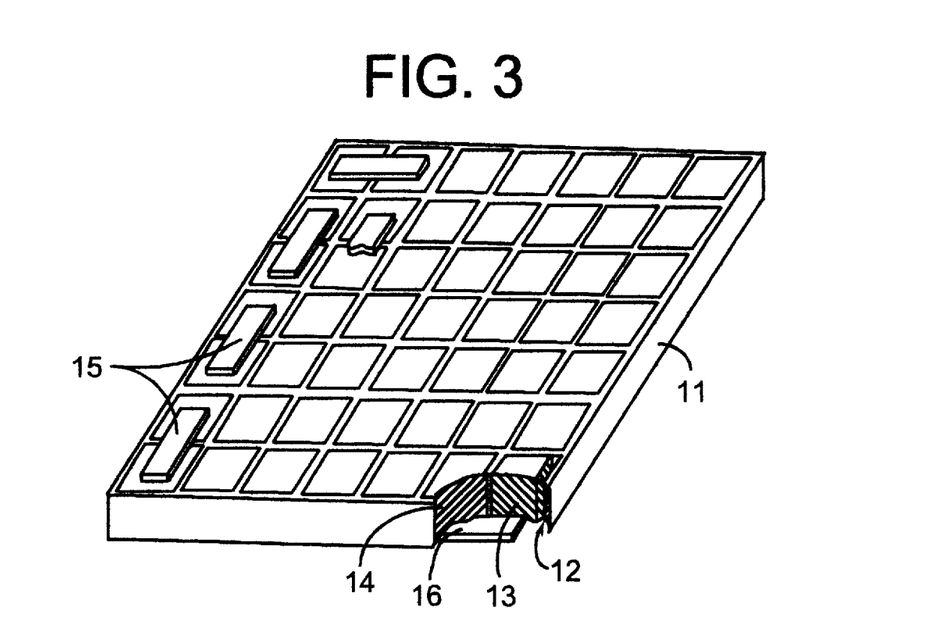
FIG. 3 is a perspective view depicting an embodiment of the thermoelectric conversion module according to the invention.

FIG. 3 is a partial cut away perspective view showing an embodiment of the thermoelectric conversion module according to the invention. The thermoelectric conversion module of the present embodiment comprises a honeycomb structural body 11 made of an electrically insulating material and having a number of thin through holes 12 in which N type semiconductor elements 13 and P type semiconductor elements 14 are installed. In the present embodiment, N type semiconductor elements 13 and P type semiconductor elements 14 are arranged alternately. Upper and lower end surfaces of the N type and P type semiconductor elements 13 and 14 are connected by means of upper electrodes 15 and lower electrodes 16 in a cascade manner.

FIGS. 4A–4F show successive steps of an embodiment of the method according to the invention for manufacturing the thermoelectric conversion module shown in FIG. 3.

Figure 4A:
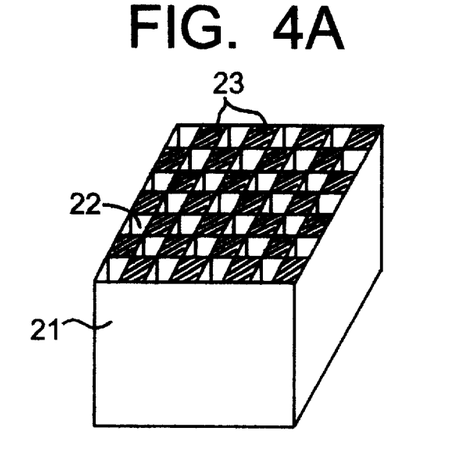
FIGS. 4A–4F are views showing successive steps of an embodiment of the method according to the invention.

At first, as illustrated in FIG. 4A, an electrically insulating honeycomb structural body 21 having a large number of channels 22 is prepared. In the present embodiment, the channels 22 are formed in the shape of through holes. This honeycomb structural body 21 is made of cordierite ($Mg_2Al$ ($AlSi_5$)$O_{18}$) and has a height of 10 cm. A dimension of a through hole 22 may be expressed by a value of a ratio of a cross sectional area S to a circumferential length a of the through hole (S/a). In the present embodiment, said value S/a is set to 0.057. In the present embodiment, a lateral cross section of a through hole 22 has a square shape, but according to the invention, the through hole may have any arbitrary cross sectional shape such as circular, rectangular and hexagonal. In FIGS. 4A–F, the through hole 22 is drawn to have a large dimension for the sake of clarity, so that the number of through holes are small. In an actual module, a very large number of through holes each having a very small cross section are formed.

In one end surface of the honeycomb structural body 21, every other through hole 22 is closed by clogging members 23. The clogging members 23 may be made of a high melting glass which can resist a high temperature of a molten semiconductor material and can prevent a penetration of the molten semiconductor material therethrough. For the sake of clarity, in FIG. 4A, the clogging members 23 are denoted by hatching.

Figure 4B:
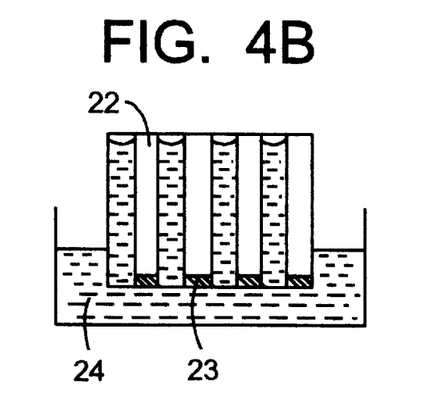

Next, as illustrated in FIG. 4B, the honeycomb structural body 21 is immersed into a molten or fused semiconductor material 24 made of $Bi_{0.88}Sb_{0.12}$ at 350° C. under an argon gas atmosphere, while the end surface of the honeycomb structural body in which the clogging members 23 are provided is faced downward. Then, the molten semiconductor material 24 is sucked into through holes 22 which are not closed by the clogging members 23 owing to the capillary phenomenon.

According to the invention, the semiconductor material melt is sucked into the through holes by the capillary phenomenon. To this end, it is preferable to form the through hole 22 such that the above mentioned ratio of a cross sectional area S of the through hole to a circumferential length a of the through hole should satisfy the following condition:

$$S/a \leq \gamma \cdot \cos \theta / h \cdot \rho \cdot g \quad (1)$$

wherein $\gamma$ is a surface tension, $\theta$ is a contact angle between a partition forming the through hole 22 of the honeycomb structural body 21 and the molten semiconductor material 24, h is a height of the molten semiconductor material which rises up within the through hole 22 having a cross sectional area S and a circumferential length a, $\rho$ is a density of the molten semiconductor material 24, and g is the acceleration of gravity. In the present embodiment, a ratio S/a is set to 0.057 mm and a height of the honeycomb structural body 21 is set to 10 cm by the following reason.

The above equation (1) represents a relationship between a cross sectional area S of a through hole 22 of the honeycomb structural body 21 having a height h and a surface tension $\gamma$ generated between a partition forming the through hole and the molten semiconductor material 24. A surface tension $\gamma$ may be expressed by the following equation (2) by using a surface tension $\gamma_s$ of the partition of the honeycomb structural body 21, a surface tension $\gamma_1$ of the semiconductor material melt 24 and a contact angle $\theta$ between the partition of the honeycomb structural body and the semiconductor material melt:

$$\gamma = \gamma_s - \gamma_1 \cos \theta \quad (2)$$

By inserting the equation (2) into the equation (1), the following equation (3) may be derived:

$$\frac{S}{a} = \frac{\cos\theta}{h \cdot \rho \cdot g}(\gamma_s - \gamma_l \cos\theta) \qquad (3)$$

Here, now it is assumed that the semiconductor material melt 24 is $Bi_{0.88}Sb_{0.12}$ and the honeycomb structural body 21 is made of cordierite. Since $Bi_{0.88}Sb_{0.12}$ belongs to a complete solid solution, it may be assumed that a formability due to a surface tension can be attained. Then, surface tensions of respective components of $Bi_{0.88}Sb_{0.12}$ may be represented by the following equations:

Bi: $\gamma_{1Bi}$=0.375 [N/m]

Sb: $\gamma_{1Sb}$=0.386 [N/m]

$Bi_{0.88}Sb_{0.12}$: $\gamma_{1BiSb}$=0.88 $\gamma_{1Sb}$+0.12 $\gamma1Sb$=0.365 [N/m]  (4)

In the present embodiment, a height h of the honeycomb structural body 21 is 10 cm, and constants in the equation (3) are assumed to have the following values:

$\rho$=9470[kg/m³]

$g$=9.8[m/S²]

It has been confirmed that a value of the ratio S/a is not changed when a contact angle $\theta$ is changed from 10° to 1°.

For $\theta$=10°, S/a=0.057 [mm]

For $\theta$=5°, S/a=0.057 [mm]

For $\theta$=1°, S/a=0.057 [mm]

From the above consideration, in the present embodiment, the ratio S/a of a through hole 22 of the honeycomb structural body 21 is selected to be 0.057 mm. Therefore, if a cross sectional configuration of the through hole 22 is square, a length of one side has to be set to 0.23 mm, if the through hole has a triangular cross section, a length of one side must be set to 0.38 mm, and if the through hole has a circular cross sectional configuration, a diameter should be set to 0.228 mm. Furthermore, a honeycomb structural body having a height of 5 cm is used, a length of one side or diameter of a through hole becomes doubles of the above mentioned values.

Figure 4C:
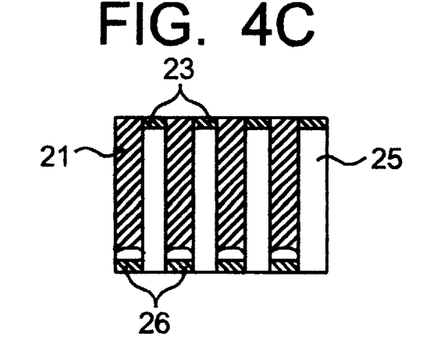

After the N type semiconductor material melt 24 has been fully sucked into the through holes 22 which are not closed by the clogging members 23 by the action of the capillary phenomenon, the honeycomb structural body 21 is pulled up from the molten semiconductor material 24, and then the semiconductor material melt sucked within the through holes 22 is cooled and solidified to form N type semiconductor elements 25 as illustrated in FIG. 4C. Next, openings of the through holes 22 into which the N type semiconductor elements 25 have been formed and which has not be immersed into the N type semiconductor material melt 24 are closed by clogging members 26. Further the end surface which was immersed into the N type semiconductor material melt 24 is polished to remove the clogging members 23 and to open the through holes into which the N type semiconductor elements 25 are not formed.

Figure 4D:
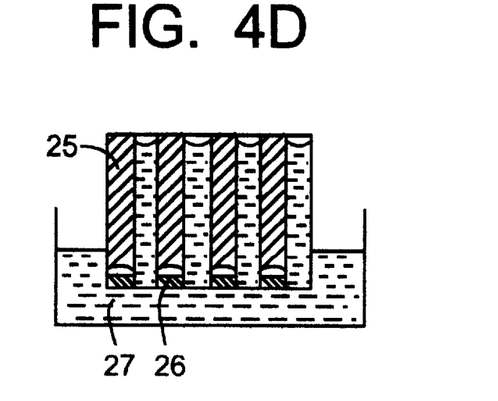

Then, as illustrated in FIG. 4D, the second end surface of the honeycomb structural body 21 is immersed into a P type semiconductor material melt 27, which is made of $Bi_{0.88}Sb_{0.12}$ having added thereto Sn by 1 weight % as P type dopant and is heated to 350° C. Then, the P type semiconductor material melt 27 is sucked into the through holes 22 by the action of the capillary phenomenon. After removing the honeycomb structural body 21 from the P type semiconductor melt 27, the honeycomb structural body 21 is cooled and the sucked semiconductor material melt is solidified to form P type semiconductor elements 28.

Figure 4E:
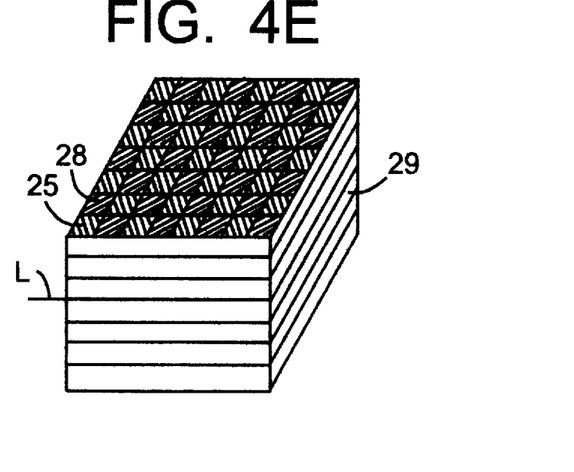

Next, as depicted in FIG. 4E, the honeycomb structural body 21 having the N type and P type semiconductor elements 25 and 28 formed within alternate through holes 22 is cut along planes L which are perpendicular to the through holes into a thermoelectric conversion module main bodies 29 each having a thickness of, for instance 5 mm. In FIG. 4E, both end surface portions are removed and adjacent N type semiconductor elements 25 and P type semiconductor elements 28 are denoted by hatchings having mutually perpendicular directions.

Figure 4F:
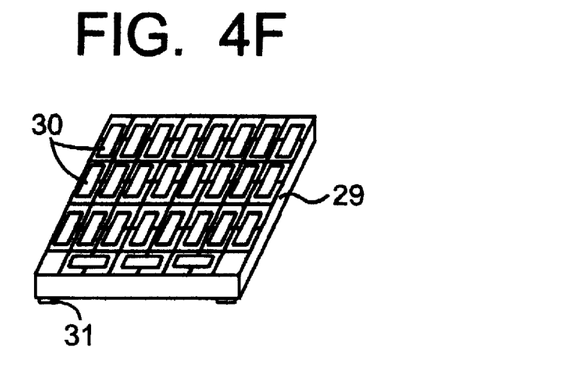

Next, as shown in FIG. 4F, on upper and lower surfaces of a thermoelectric conversion module main body 29 are formed electrodes 30 and 31, respectively in accordance with given patterns by means of, for instance a screen printing. In this manner, the N type semiconductor elements 25 and P type semiconductor elements 28 are alternately connected in cascade to complete the thermoelectric conversion module shown in FIG. 3.

FIGS. 5A–5F show successive steps of another embodiment of the method of manufacturing the thermoelectric conversion module according to the invention. In the above mentioned embodiment, in successive through holes 22 of the honeycomb structural body 21, there are formed alternately the N type and P type semiconductor elements 25 and 28. According to the present embodiment, a number of through holes of a honeycomb structural body are divided into a number of groups. Each of the groups contains a plurality of adjacent through holes, and through holes of alternate groups contain N type semiconductor elements and P type semiconductor elements, respectively.

Figure 5A:
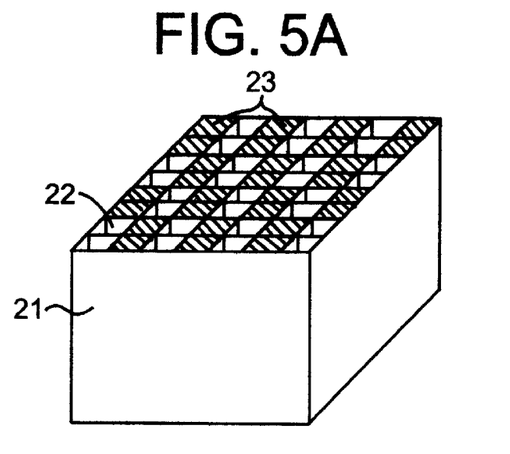
FIGS. 5A–5F are views representing successive steps of another embodiment of the method according to the invention.

At first, as shown in FIG. 5A, in a first end surface of a honeycomb structural body 21, openings of every two through holes 22 belonging to groups in which P type semiconductor elements are to be formed are closed by clogging members 23 made of a heat resistant and liquid proof material. For the sake of clarity, these clogging members 23 are denoted by hatching.

Figure 5B:
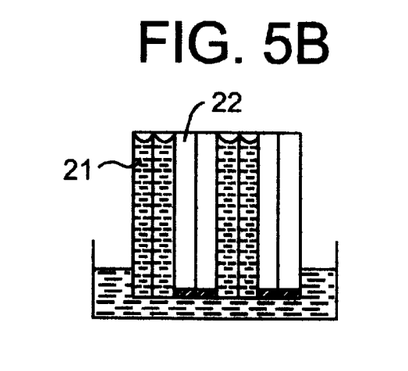
Figure 5C:
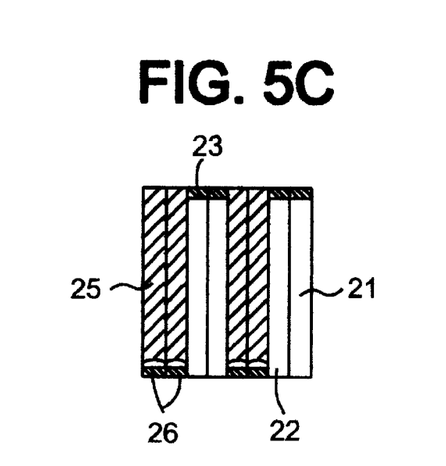

Next, as depicted in FIG. 5B, the first end surface of the honeycomb structural body 21 is immersed into an N type molten semiconductor material 24 to suck the N type semiconductor material melt into through holes which are not closed by the clogging members 23 under the capillary phenomenon. After pulling up the honeycomb structural body 21 from the N type semiconductor melt 24, the N type molten semiconductor material sucked into the through holes is cooled and solidified to form N type semiconductor elements 25 as illustrated in FIG. 5C. Then, in the second end surface of the honeycomb structural body 21, openings of the through holes in which the N type semiconductor elements 25 are formed are closed by clogging members 26. Furthermore, the first end surface of the honeycomb structural body 21 is ground to remove the clogging members 23 which close vacant through holes 22. In this manner, the through holes 22 belonging to groups in which N-type semiconductor elements are not formed are opened.

Figure 5D:
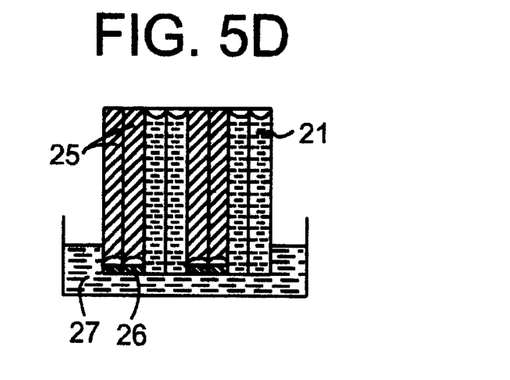
Figure 5E:
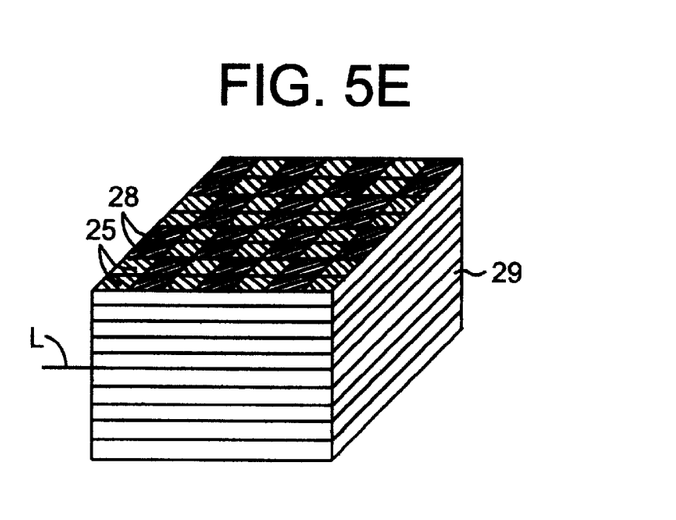

Next, as illustrated in FIG. 5D, the honeycomb structural body 21 is immersed in a P type semiconductor material melt 27 while the second end surface of the honeycomb structural body is faced downward. Then, the is P type semiconductor material melt 27 is sucked into the through holes 22 by means of the capillary phenomenon. After that, the honeycomb structural body 21 is pulled up from the P type semiconductor melt 27 and is cooled to from the P type semiconductor elements 28 within the through holes 22 as depicted in FIG. 5E. Similar to the previous embodiment, the honeycomb structural body 21 having the N type and P type semiconductor elements 25 and 28 formed within the through holes 22 is cut along planes L to form a plurality of thermoelectric conversion module main bodies 29 each having a thickness of 5 mm. In FIG. 5E, the N type and P type semiconductor elements 25 and 28 are denoted by hatchings having mutually perpendicular directions for the sake of clarity.

Figure 5F:
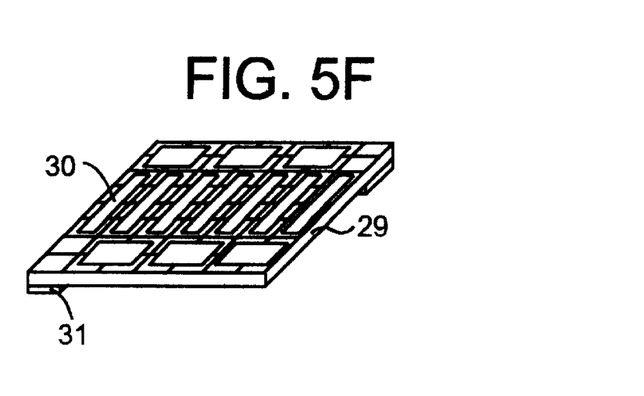

Finally, on upper and lower surfaces of the thermoelectric conversion module main body 29 are provided electrodes 30 and 31, respectively by means of a screen printing as shown in FIG. 5F. In this manner, groups of the N type semiconductor elements 25 and groups of the P type semiconductor elements 26 arranged alternately are connected in cascade.

According to the invention, the number of semiconductor elements belonging to one group and an arrangement of these semiconductor elements may be set arbitrarily. For instance, 10×10 semiconductor elements may be set to a single group. In such a case, 10×10 N type semiconductor elements of one group and 10×10 P type semiconductor elements of an adjacent group may be connected by means of an electrode.

FIGS. 6A–6F show successive steps of still another embodiment of the method of manufacturing the thermoelectric conversion module according to the invention. In the present embodiment, use is made of a honeycomb structural body with through holes which are selectively clogged. Such a honeycomb structural body and a method of manufacturing the same are described in various publications such as Japanese Patent Application Laid-open Publications Kokai Sho 57-7215, 58-37480, 59-64296, 59-64298, 59-177114, 60-71019 and 62-144726.

Figure 6A:
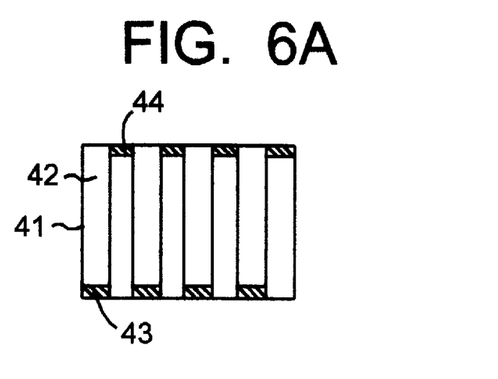
FIGS. 6A–6F are views illustrating successive steps of another embodiment of the method according to the invention.

As illustrated in FIG. 6A, a honeycomb structural body 41 has formed therein a number of through holes 42, and openings of adjacent through holes 42 are closed by clogging members 43 and 44 on both first and second end surfaces of the honeycomb structural body. In the present embodiment, the clogging members 43 and 44 are made of porous cordierite which can pass an air but hardly pass a molten semiconductor material.

Figure 6B:
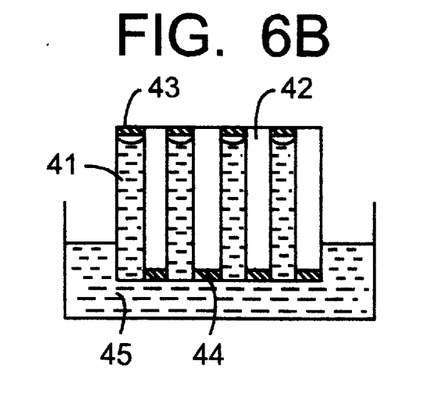
Figure 6C:
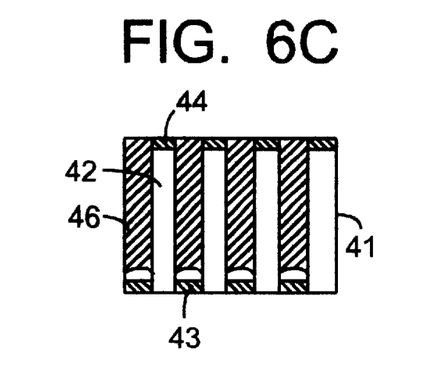

Next, as depicted in FIG. 6B, the honeycomb structure 41 is immersed into an N type semiconductor material melt 45, while the first end surface of the honeycomb structural body 41 in which the clogging members 44 are provided is faced downward. Then, the N type semiconductor material melt 45 is sucked into alternate through holes 42 which are opened in the first end surface by an action of the capillary phenomenon. It should be noted that since the clogging materials 43 and 44 can pass air, the capillary phenomenon could not be prevented. Moreover, since the clogging materials 43 and 44 hardly pass the molten semiconductor material, the N type semiconductor material melt 45 is not sucked into through holes 42 whose openings are closed by the clogging materials 44. After sucking, the honeycomb structural body 41 is pulled up from the N type semiconductor material melt 45, and then is cooled to form N type semiconductor elements 46 within every other through holes 42 as illustrated in FIG. 6C. Then, the first end surface of the honeycomb structural body 41 is mechanically polished or chemically etched to remove semiconductor materials deposited on the clogging members 44. A chemical etching may be performed by using a nitric acid as an etchant. If the semiconductor material on the clogging members 44 is not removed, the clogging members could not effectively pass the air, so that the capillary phenomenon might not be performed efficiently.

Figure 6D:
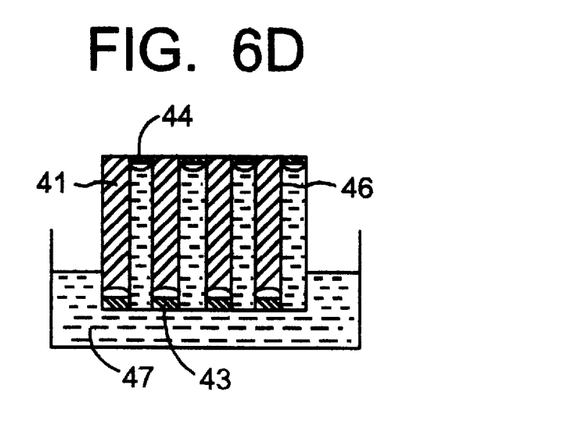
Figure 6E:
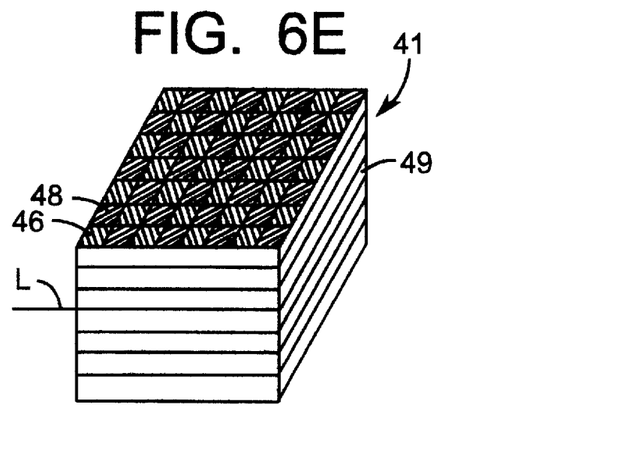

Next, as shown in FIG. 6D, the honeycomb structural body 41 is immersed into a P type semiconductor material melt 47, while the second end surface of the honeycomb structural body is faced downward. Then, the P type semiconductor material melt 47 is sucked into vacant through holes 42 by means of the capillary phenomenon. Next, the P type semiconductor material melt sucked into the through holes 42 of the honeycomb structural body 41 is cooled to form P type semiconductor elements 48 as illustrated in FIG. 6E. In this manner, the N type and P type semiconductor elements 46 and 48 are formed within alternately arranged through holes 42 of the honeycomb structural body 41. Then, the honeycomb structural body 41 is cut along planes L as shown in FIG. 6E to form a plurality of thermoelectric conversion module main bodies 49 each having a thickness of 5 mm. Also in FIG. 6E, the N and P type semiconductor elements 46 and 48 are denoted by hatchings having mutually perpendicular directions.

Figure 6F:
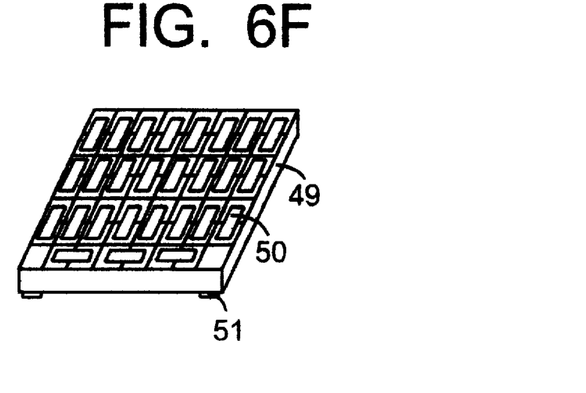

Finally, as illustrated in FIG. 6F, alternately arranged N type semiconductor elements 46 and P type semiconductor elements 48 are connected in cascade by means of electrodes 50 and 51 situating on opposite surfaces of the honeycomb structure main body 49 to complete a thermoelectric conversion module.

In the present embodiment, the honeycomb structural body 41 having the through holes 42 whose openings are closed by clogging members 43 and 44 which can pass the air but could hardly pass the molten semiconductor materials 45 and 47 is used as a starting material, and therefore the process is rather simpler than those of the previous embodiments.

Figure 7A:
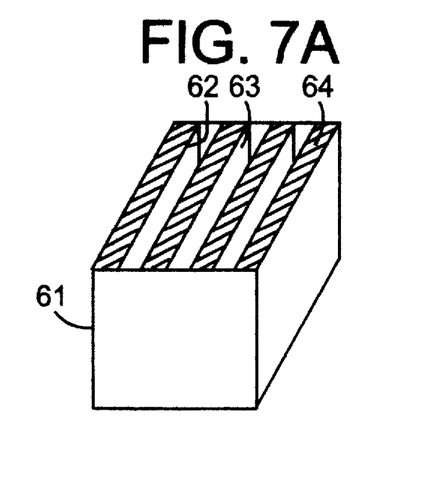
FIGS. 7A–7F are views depicting successive steps of still another embodiment of the method according to the invention.
Figure 7B:
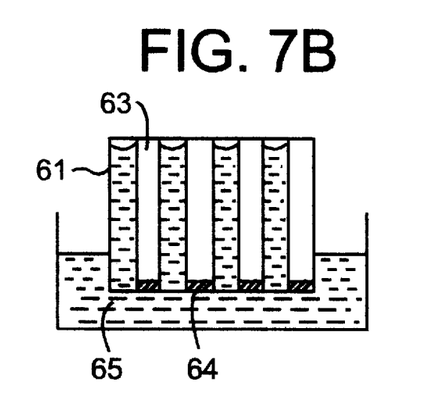
Figure 7C:
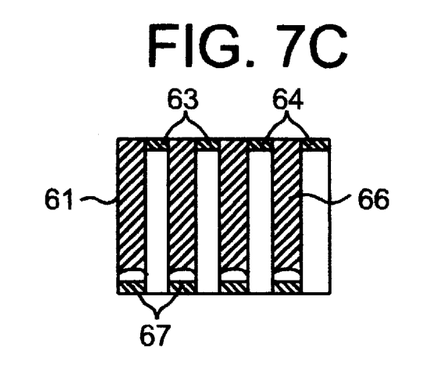

FIGS. 7A–7R show successive steps of a fourth embodiment of the method of manufacturing the thermoelectric conversion module according to the invention. In the present embodiment, use is made of a structural body 61 having a number of channel formed in the shape of slits 62. These slits 62 are defined by partitions 63. The structural body 61 may be made of an electrically insulating and heat resistant material such as cordierite. At first, in one end surface of the structural body 61, openings of every other slit 62 are closed by clogging members 64 as illustrated in FIG. 7A. Then, the structural body 61 is immersed into an N type semiconductor material melt 65 to suck the melt into every other slits 62 by means of the capillary phenomenon, openings of said slits 62 being not closed by the clogging members 64. The N type semiconductor melt 65 may be obtained by heating $Bi_{0.88}Sb_{0.12}$ at 350° C. After that, the structural body 61 is pulled up from the N type semiconductor material melt 65, and then is cooled to form N type semiconductor elements 66 as shown in FIG. 7C.

Next, the openings of the through holes 62 within which the N type semiconductor elements 66 are formed are closed by clogging members 67, and further the end surface of the structural body 61 is polished to remove the clogging members 64.

Figure 7D:
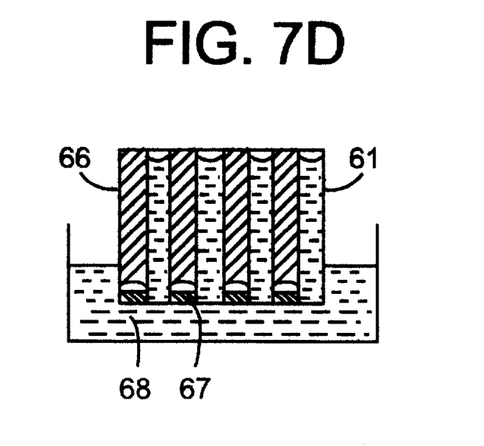

Then, as depicted in FIG. 7D, the structural body 61 is immersed into a P type semiconductor material melt 68 which contains $Bi_{0.88}Sb_{0.12}$ and Sn by 1 weight % as P type dopant. Then, the molten P type semiconductor material 68 is sucked into the slits 63 whose openings are not closed, by an action of the capillary phenomenon. After pulling up the structural body 61 from the P type semiconductor material melt 68, the structural body is cooled to form P type semiconductor elements 69 within the slits 63.

Figure 7E:
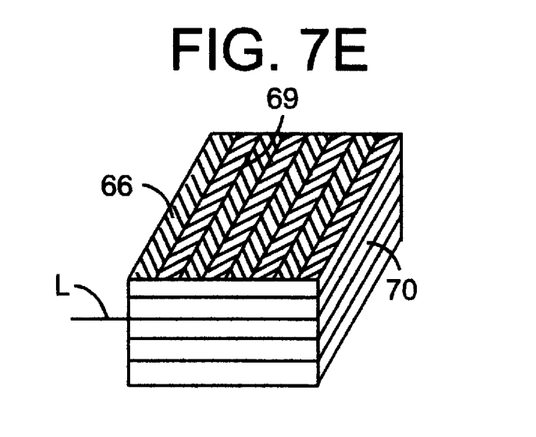

Next, as shown in FIG. 7E, the structural body 61 having the N type and P type semiconductor elements 66 an 69 within alternate slits 63 is cut along planes L to obtain a plurality of thermoelectric conversion module main bodies 70 each having a thickness of 5 mm.

Figure 7F:
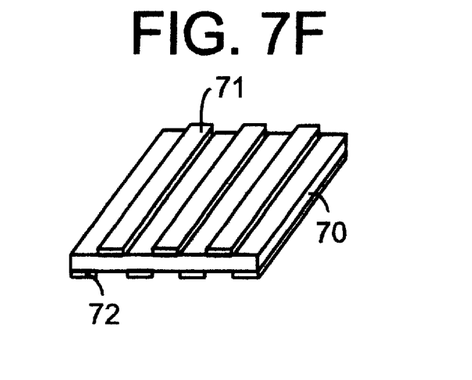

Finally, on opposite surfaces of the thermoelectric conversion module main body 70 there are provided electrodes 71 and 72, respectively to connect successive N type and P type semiconductor elements 66 and 69 in series as shown in FIG. 7F.

In this manner, a final thermoelectric conversion module is obtained.

Figure 8:
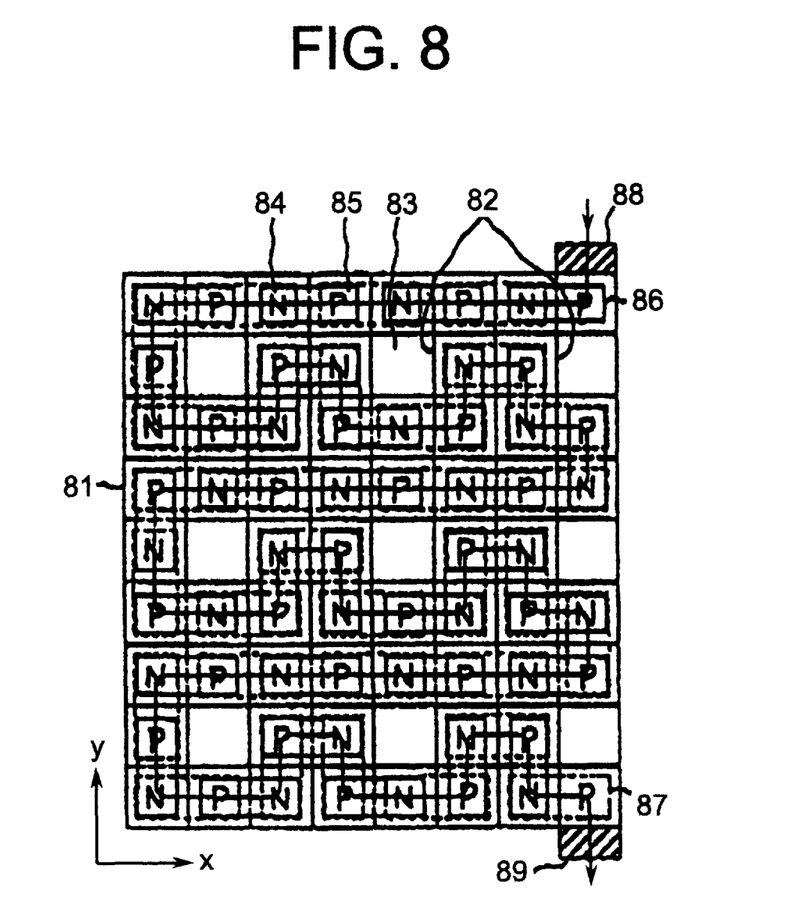
FIG. 8 is a schematic plan view showing another embodiment of the thermoelectric conversion module according to the invention.

FIG. 8 is a schematic plan view showing another embodiment of the thermoelectric conversion module according to the invention. In the present embodiment, a honeycomb structural body 81 includes a number of channels in the form of through holes 82. N type and P type semiconductor elements 84 and 85 are formed by sucking N type and P type semiconductor material melts into through holes 82 which are arranged about through holes filled with a thermal insulating material 83. That is to say, distances between each of the through holes in which the N type and P type semiconductor elements 84 and 85 are formed and the thermal insulating material 83 become substantially identical with each other. During the formation of the N and P type semiconductor elements 84 and 85, the through holes 82 having the thermal insulating material 83 formed therein are left vacant and a cooling medium such as nitrogen or inert gas is flowed through the vacant through holes. In this manner, molten semiconductor materials sucked within the through holes 82 can be cooled rapidly, so that undesired segregation of components of semiconductor materials can be avoided. After forming the N type and P type semiconductor elements 84 and 85, the vacant through holes are filled with the heat insulating material such as glass, ceramic fibers or porous ceramics. It should be noted that according to the invention it is not always necessary to fill the thermal insulating material in the vacant through holes after forming the semiconductor elements. Furthermore, if a length of the through holes 82 in the x direction is made larger than a length in the y direction, the channel is formed as a slit. In FIG. 8, reference numerals 86 and 87 denote metal electrodes connecting the N type and P type semiconductor elements 84 and 85 in cascade, and reference numerals 88 and 89 represent terminals of the thermoelectric conversion module. Between these terminals 88 and 89, an electric current flows as shown by an arrow in FIG. 8.

The present invention is not limited to the embodiments so far explained, but many alternations and modifications can be considered by those skilled in the art within the scope of the invention defined by claims. For instance, in the above explained embodiments, the thermoelectric conversion module has flat surfaces, but according to the invention one or both of opposite surfaces of the thermoelectric conversion module may be curved.

Figure 9A:
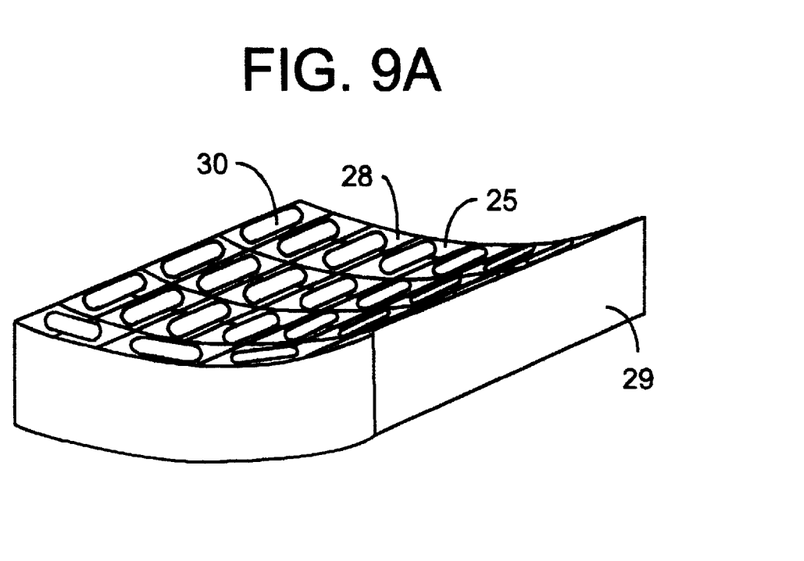
FIGS. 9A–9B are perspective views depicting another embodiment of the thermoelectric conversion module according to the invention.
Figure 9B:
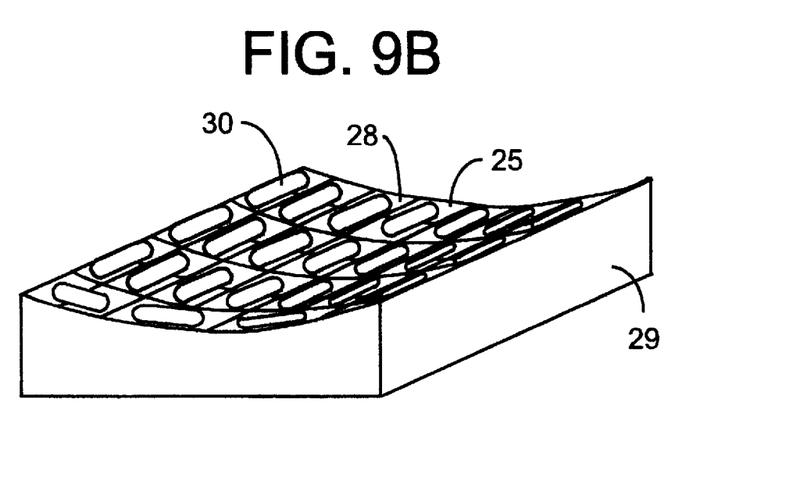

FIG. 9 is a perspective view showing an embodiment of the thermoelectric conversion module according to the invention, in which both surfaces of a honeycomb structure main body 29 having N and P type semiconductor elements 25 and 28 formed therein are curved. In the present embodiment, both surfaces of the thermoelectric conversion surfaces have the identical curved shape, but according to the invention a curved shape of an upper surface of the module may be different from a curved shape of the other surface. In this manner, according to the invention, surface configuration of the thermoelectric conversion module may be designed in accordance with a surface configuration of a base member on which the thermoelectric conversion module is to be secured.

Furthermore, in the above embodiments, an electrode connecting one or more N type semiconductor elements and adjacent one or more P type semiconductor elements in series is formed by the screen printing. According to the invention, the electrode may be formed by any other printing method. Moreover, electrodes may formed on a surface of an insulating plate in accordance with a given pattern and then the insulating plate may be placed on the surface of the thermoelectric conversion module main body.

As explained above in detail, in the thermoelectric conversion module according to the invention, the N and P type semiconductor elements are formed by sucking molten semiconductor materials into channel in the form of through holes or slits by means of the capillary phenomenon, and thus it is possible to realize easily a thermoelectric conversion module having a large capacity. Moreover, the surface configuration of the thermoelectric conversion module may be set to any desired shape, and thus it is possible to obtain a thermoelectric conversion module which can be intimately secured to a curved surface of a base member.

Furthermore, in the method of manufacturing the thermoelectric conversion module according to the invention, a structural body having a number of thin through holes or slits formed therein is immersed into a molten semiconductor material and the semiconductor material melt is sucked into the through holes or slits by an action of the capillary phenomenon. Then, the thus sucked semiconductor material is cooled to form semiconductor elements within the through holes or slits. After that, the structural body is cut into thermoelectric conversion module main bodies each having a given thickness. In this manner, it is possible to form easily a thermoelectric conversion module having a large capacity and a desired surface configuration at a less expensive manner.

What is claimed is:

1. A thermoelectric conversion module comprising:

a structural body comprising an electrically insulating material having a first surface, a second surface opposed to said first surface, and a plurality of channels which extend from said first surface to said second surface, each of said channels having a size that enables molten semiconductor material to be sucked into the channels by capillary phenomenon;

a plurality of N type semiconductor elements which are formed by sucking an N type semiconductor material melt into selected ones of said channels of said structural body;

a plurality of P type semiconductor elements which are formed by sucking a P type semiconductor material melt into selected ones of said channels of said structural body; and metal electrodes provided on said first and second surfaces of the structural body such that adjacent one or more N type semiconductor elements and one or more P type semiconductor elements are connected in series by means of said metal electrodes wherein said channels are formed to satisfy the following condition:

$$S/a \leq \gamma \cdot \cos\theta / h \cdot \rho \cdot g$$

wherein S is a cross sectional area of the channel, a is a circumferential length of the channel, $\gamma$ is a surface tension, $\theta$ is a contact angle between the semiconductor material melt and a partition which constitutes said channel, h is a height of the molten semiconductor material which rises up within the channel by the capillary phenomenon, $\rho$ is a density of the semiconductor material melt, and g is the acceleration of gravity.

2. A thermoelectric conversion module according to claim 1, wherein said structural body comprises a plurality of channels within which N type and P type semiconductor elements are not formed and which are distributed such that said N type and P type semiconductor elements are connected in series, and the thermoelectric conversion module further comprises a plurality of thermal insulating materials provided in said channels.

3. A thermoelectric conversion module according to claim 2, wherein the number of N and P type semiconductor elements surrounding said channels in which the thermal insulating material is provided are made substantially equal, and distances between these N and P type semiconductor elements and the thermal insulating material are substantially identical with each other.

4. A thermoelectric conversion module according to claim 1, wherein said metal electrodes are formed by screen printing.

5. A thermoelectric conversion module according to claim 1, wherein at least one of said first and second surfaces of the structural body is curved.

6. A thermoelectric conversion module according to claim 1, wherein said structural body comprises a honeycomb structural body having a number of through holes formed therein, and said channels comprise said through holes.

7. A thermoelectric conversion module according to claim 6, wherein said honeycomb structural body comprises cordierite.

8. A thermoelectric conversion module according to claim 1, wherein each of said through holes is formed in the shape of a slit.

* * * * *

UNITED STATES PATENT AND TRADEMARK OFFICE
CERTIFICATE OF CORRECTION

PATENT NO. : 5,886,291
DATED : March 23, 1999
INVENTOR(S) : Yuichiro IMANISHI et al.

It is certified that error appears in the above-indentified patent and that said Letters Patent is hereby corrected as shown below:

On the title page, item [54], Foreign Application Priority Data change "Nov. 3, 1995" to --Nov. 13, 1995--.

Signed and Sealed this

Thirteenth Day of July, 1999

Attest:

Q. TODD DICKINSON

*Attesting Officer*  *Acting Commissioner of Patents and Trademarks*